United States Patent
Wong et al.

(10) Patent No.: US 6,596,442 B1
(45) Date of Patent: Jul. 22, 2003

(54) ASYMMETRIC HALFTONE BIASING FOR SUB-GRID PATTERN ADJUSTMENT

(75) Inventors: Alfred K. Wong, Beacon, NY (US); Richard A. Ferguson, Pleasant Valley, NY (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/533,831

(22) Filed: Mar. 23, 2000

(51) Int. Cl.$^7$ .................................................. G03F 9/00
(52) U.S. Cl. .............................................. 430/5; 430/30
(58) Field of Search ...................................... 430/5, 30

(56) References Cited

U.S. PATENT DOCUMENTS

| | | | | |
|---|---|---|---|---|
| 5,705,301 A | * | 1/1998 | Garza et al. .................... | 430/5 |
| 5,733,687 A | | 3/1998 | Tanaka et al. | |
| 5,827,623 A | | 10/1998 | Ishida et al. | |
| 5,879,844 A | | 3/1999 | Yamamoto et al. | |
| 6,044,007 A | * | 3/2000 | Capodieci ................... | 365/120 |
| 6,174,630 B1 | * | 1/2001 | Petranovic et al. ............ | 430/5 |

* cited by examiner

Primary Examiner—Mark F. Huff
Assistant Examiner—Saleha R. Mohamedulla
(74) Attorney, Agent, or Firm—Jay H. Anderson (57) ABSTRACT

A technique is described, based on concepts of halftone printing, for controlling feature dimensions in a printed image at increments smaller than the smallest addressable unit of the template used to produce that image. Accordingly, photomasks may be fabricated to yield images with sizes differing from a nominal width by increments which are small fractions of the minimum template size or pixel size. A template fabricated according to this technique includes a feature having one or more edges, and a first array and a second array of shapes (protrusions or indentations) disposed on the edges. The first and second arrays have respective segmentation periods; the first and second segmentation periods are different. Each array is formed of a plurality of identical shapes repeating at every corresponding segmentation period, each shape having a predetermined length and a predetermined width. The shapes (protrusions or indentations) in the first array and the second array may have different lengths, in addition to the two arrays having different segmentation periods; a line feature on a template will thus appear asymmetric with respect to both the length and period of the shapes along the edges of the feature.

17 Claims, 14 Drawing Sheets

ASYMMETRIC HALFTONE BIASING FOR SUB-GRID PATTERN ADJUSTMENT

FIELD OF THE INVENTION

The present invention relates to a technique for controlling the size of an image formed by using a template. More particularly, the present invention relates to a sub-grid biasing technique for fabricating photomasks used in VLSI lithography for semiconductor processing, where the photomask has a halftone type pattern so that images formed on semiconductor wafers are related, but not identical, to the sizes and shapes of the photomask features.

BACKGROUND OF THE INVENTION

Photomask manufacturers continue to be challenged by the demands of customers who require smaller and more precise features on wafers. In particular, the need for subtle differences in line width on features in the same reticle is forcing the use of smaller pixel sizes on raster scan e-beam systems to write customer patterns on a photomask.

A smaller pixel size is beneficial when performing, for example, optical proximity correction of line width biasing. On the logic gate level, for instance, optical proximity effects cause lines situated in different environments, which nominally are of the same dimension, to print differently. This problem may be overcome by biasing the mask features as a function of pitch.

The efficiency of this approach is limited by the pixel size or design grid $\Delta$. In general, when an image is printed using a template, the width of a line in the template is limited to integral multiples of $\Delta$. To ensure that an error in the printed image is no larger than $\Delta/2$ requires a design grid of $\Delta$. In the case of photomasks used for printing on wafers, the design grid is forced to be smaller still as the wafer critical dimension (CD) becomes increasingly sensitive to mask dimension error (expressed as the mask error factor MEF) at small $k_1$ factors ($k_1$ being CD divided by $\lambda/NA$, where $\lambda$ is the wavelength of the light and NA is the numerical aperture of a corresponding exposure system). A $\Delta/2$ error bound requires a design grid of $\Delta/MEF$.

Figure 1:
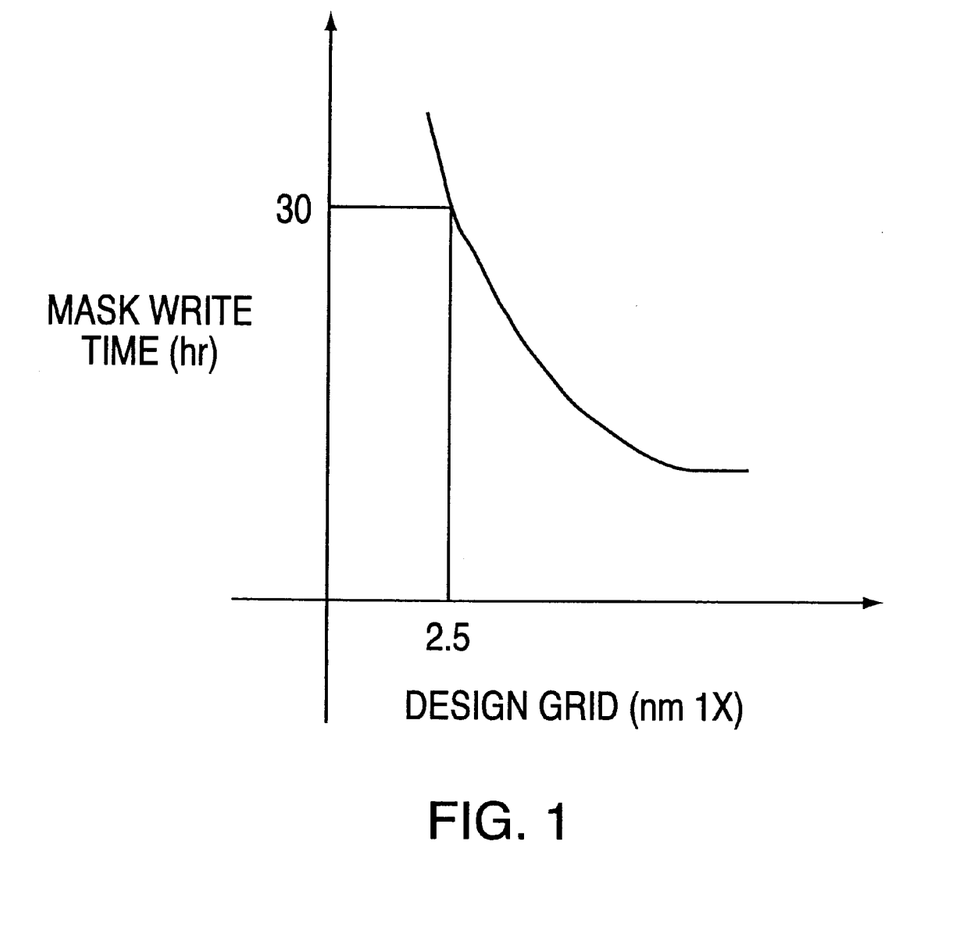
FIG. 1 is a graph illustrating the relationship between design grid and write time for a typical photomask.

For example, if an error bound $\Delta/2$ of 2.5 nm is desired (which typically will be required in the near future), and the MEF is 2, the required design grid $\Delta$ on the mask is then 2.5 nm. However, the use of a smaller design grid (smaller pixel size) increases the time required to write a pattern on the mask, which in turn reduces throughput and increases production costs. As shown in FIG. 1, the writing time for a mask of a given size increases quadratically with decreasing design grid size. Although state-of-the-art mask writers allow a design grid $\Delta$ of 2.5 nm at 1×reduction, a 6 inch square reticle with such a design grid would require a prohibitively long 30 hours of write time. A design grid of 2.5 nm is thus too small for efficient mask writing.

Accordingly, it is desirable to design with a grid much larger than 2.5 nm (for example, $\Delta=25$ nm for which the write time is approximately one hour), but still achieve image size increments of 2.5 nm. It will be increasingly important to have this capability when designing future generations of electronic circuits.

A conventional technique for solving this problem is called halftone biasing. The halftone biasing technique incorporates the application of a sub-resolution halftone screen to the edges of features.

Figure 2A:
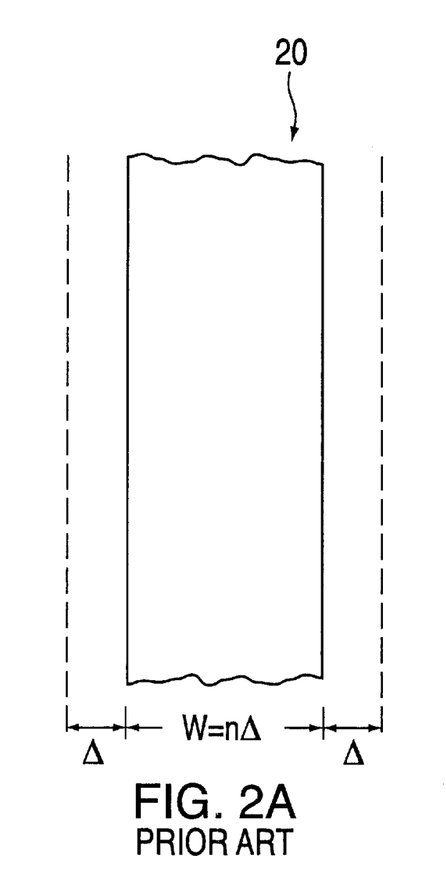
FIGS. 2A, 2B and 2C illustrate the conventional halftone biasing technique.
Figure 2B:
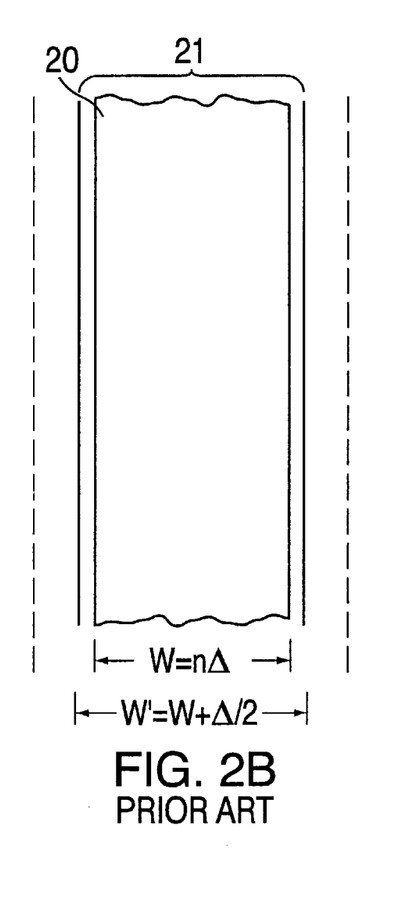
Figure 2C:
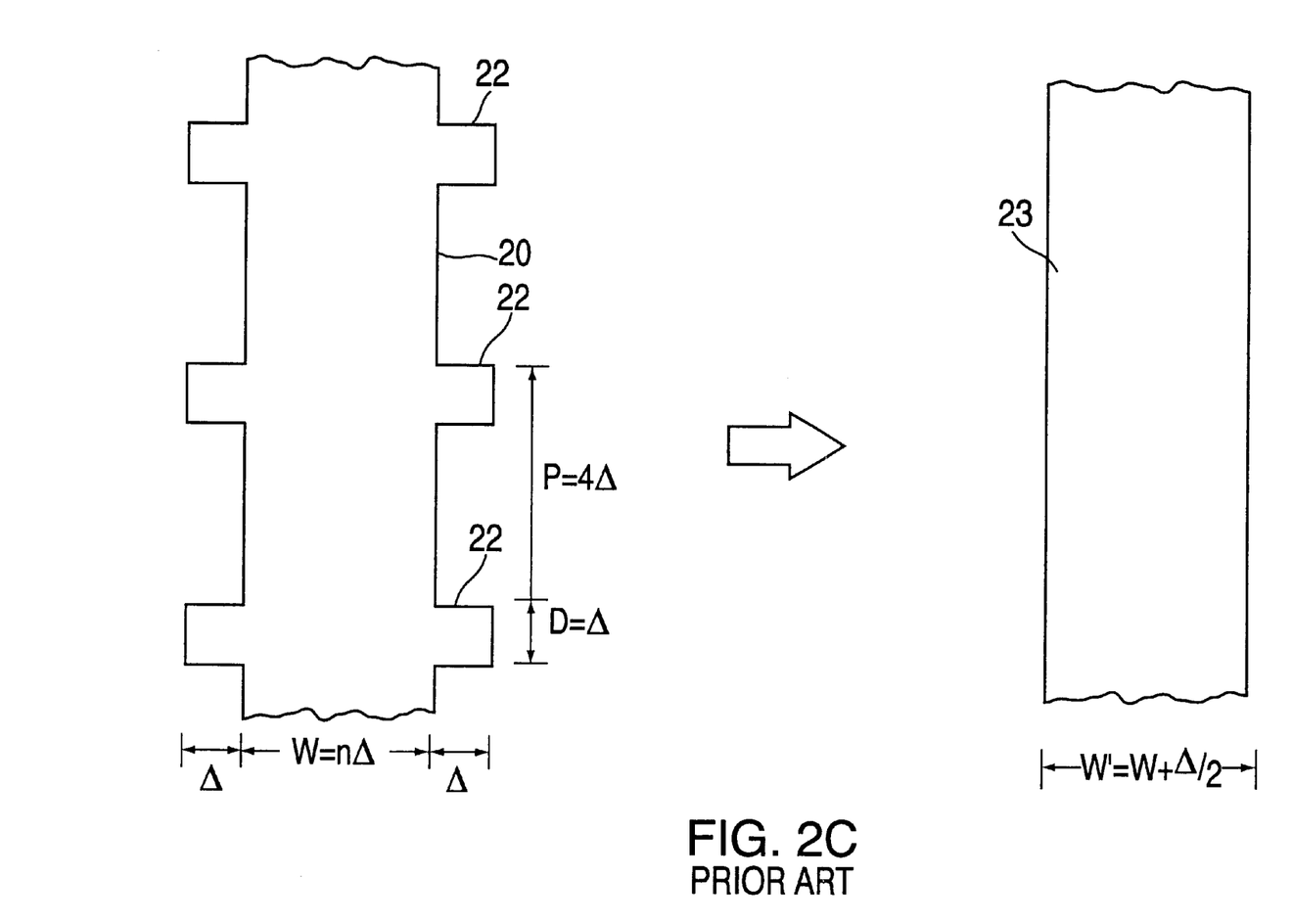

FIGS. 2A–2C illustrate the conventional halftone biasing technique. In FIG. 2A, a mask has a shape 20 formed therein of width W. Since the mask is written with a design grid $\Delta$, width W must be an integral multiple of the design grid $\Delta$, so that $W=n\Delta$ where n is an integer. Suppose, however, that a critical dimension of $W'=W+\Delta/2$ is desired; that is, the printed image 21 is desired to have a width of W' (see FIG. 2B). The halftone biasing technique can be used to achieve this effect. As shown in FIG. 2C, an array of protrusions 22 of width $\Delta$ is formed on the edge of the mask feature of width W. These protrusions (or "teeth" on the edge of the feature) have a tight enough segmentation period or pitch, P, so that their details are not resolved when the line is imaged (for example, printed on a semiconductor wafer). However, the presence of these protrusions on the mask influences the width of the printed image. The amount of this influence is determined by the "halftone percentage" of the arrangement of the teeth.

This approach is analogous to halftone printing. Since the exposure system acts as a low-pass filter, spatial periods less than $\lambda/NA(1+\sigma)$ are not resolved ($\sigma$ being the partial coherence factor). For mask features having periods beyond this resolution limit, only the average transmittance is captured by the exposure system.

For example, as shown in FIG. 2C, protrusions 22 have a width of one design grid $\Delta$ and a length D (distance along the edge of the feature) of one design grid $\Delta$; these protrusions are placed on the edges of the feature 20 with a segmentation period or pitch $P=4\Delta$. The halftone percentage, per edge of the feature, is defined by $(D/P)\times100$ (%). Although the protrusions are evident on the mask pattern, they are not replicated in the printed image. Instead, the printed image 23 has straight edges with a critical dimension dependent on the halftone percentage. In this example, with $D=\Delta$ and $P=4\Delta$, the halftone percentage is $(1/4)\times100\%=25\%$. Each edge of the printed image is thus shifted by $\Delta/4$. The critical dimension of the feature, when actually printed, is thus $W'=W+2\times(\Delta/4)$, or $W'=W+\Delta/2$. The halftone biasing technique thus permits finer control of the printed image without reducing the design grid (or in e-beam mask generation, the address unit size).

In general, an edge may be biased with an increment of $\Delta/n$ if the edge is segmented into periodic units of $n\Delta$, where n is a positive integer. (Accordingly, $\Delta/n$ is termed the apparent grid.) However, the increment cannot be made arbitrarily small, because the segmentation period $n\Delta$ is limited by the resolution of the exposure system; that is, n has a maximum value $n_{max}$, given by $$n_{max}\Delta \leq \lambda/NA(1+\sigma).$$

Figure 3:
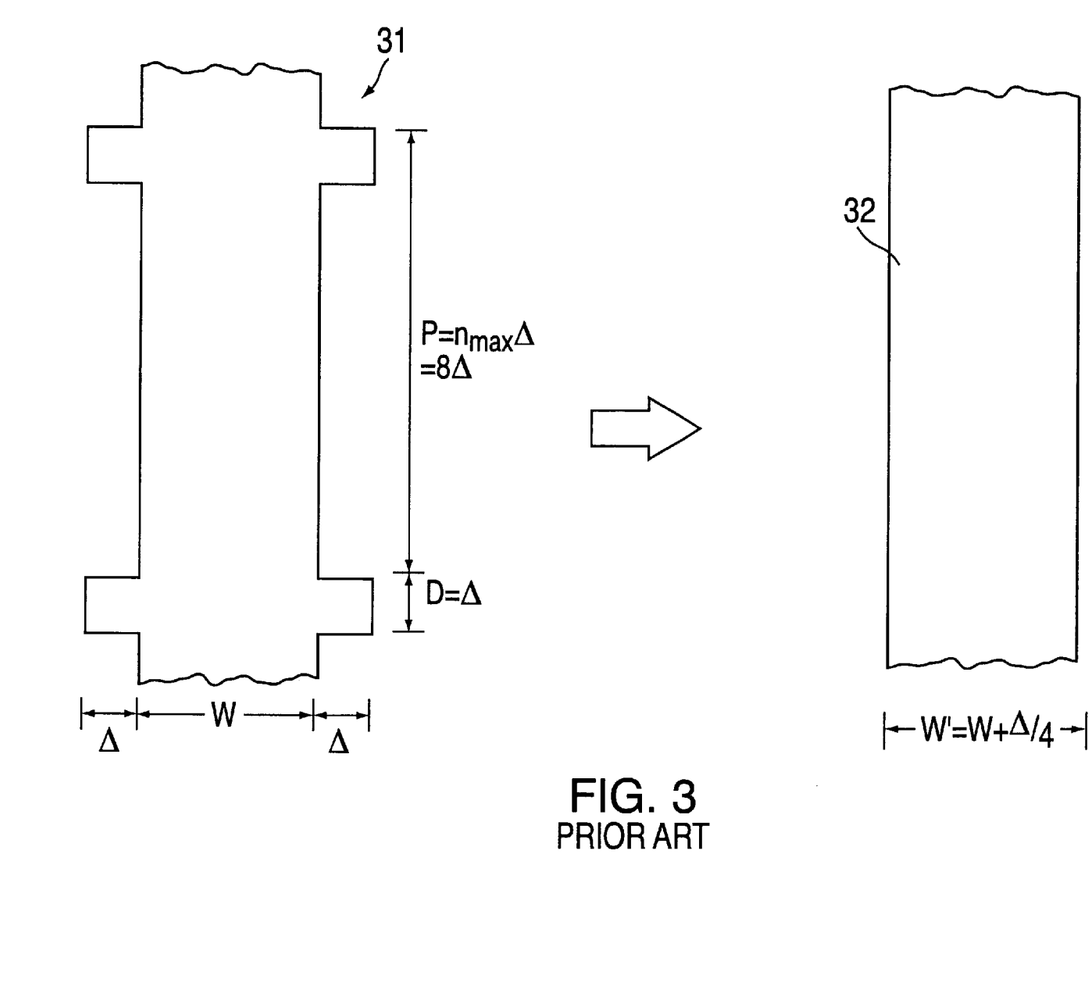
FIG. 3 shows how a feature line designed with a grid width $\Delta$ and length $\Delta$ can be biased in increments of $\Delta/8$ if the edge is segmented into periodic units of $8\Delta$, in accordance with the conventional halftone biasing technique.

For an exposure system where $\lambda=248$ nm, $NA=0.68$, $\sigma=0.8$ and $\Delta=25$ nm, this expression yields $n_{max}=8$. In such an exposure system, an edge of a feature line 31 designed with a grid of $\Delta$ can be biased in increments of $\Delta/8$, if the edge is segmented into periodic units of $8\Delta$ as shown in FIG. 3; the printed line 32 then will have a width $W'=W+2\times(\Delta/8)=W+\Delta/4$.

There is a need for a sub-grid biasing method which can further reduce the available biasing increment (that is, further reduce the apparent grid relative to the design grid), thereby permitting improved control of the printed feature size while limiting the required writing time for the photomask.

SUMMARY OF THE INVENTION

The present invention provides a technique, based on concepts of halftone printing, for controlling feature dimensions in a printed image at very small increments. The invention permits these increments to be smaller than the smallest addressable unit of the template used to produce that image. Specifically, this technique permits fabrication of photomasks yielding images with sizes differing from a nominal width by increments which are small fractions of the minimum template size or pixel size. Stated another way, the present invention provides a technique for reducing the ratio of the apparent grid to the design grid, without decreasing the size of the design grid.

According to a first aspect of the present invention, a template for forming an image includes a feature having one or more edges, with a first array of shapes and a second array of shapes disposed on the edges. The first and second arrays have a first and a second segmentation period, respectively, and the first and second segmentation periods are different. In a typical arrangement, the feature is a line having two edges, and an array of protrusions or indentations is disposed on each edge. Each array may be formed of a plurality of identical shapes repeating at every corresponding segmentation period, each shape having a predetermined length and a predetermined width. Typically, all shapes have an identical width.

A shape in an array may have a length which is a first multiple of the identical width, and a segmentation period of the array which is a second multiple of the identical width, the second multiple being greater than the first multiple.

According to another aspect of the invention, the shapes of the first array and the shapes of the second array have different lengths, in addition to the two arrays having different segmentation periods. Accordingly, a line feature on a template will appear asymmetric with respect to both the length and period of the shapes (protrusions or indentations) along the edges of the feature.

According to another aspect of the invention, at least one edge of the feature has a plurality of arrays of shapes disposed along the edge. Each of the arrays has an inner boundary and an outer boundary with respect to the edge, so that the inner boundary of a given array is coincident with the outer boundary of a neighboring array closer to the edge; the arrays also have different segmentation periods.

According to a further aspect of the invention, a template for forming an image includes a two-dimensional feature having one or more edges, with a first array and a second array disposed on the edges; the arrays have a first segmentation period and a second segmentation period, respectively, with the first and second segmentation periods being different from each other. The feature may be a rectangle having two pairs of opposite edges, with an array of shapes (protrusions or indentations) disposed along each edge. Each array in a pair of arrays on opposite edges has a different segmentation period, for both length and width control of the image.

According to another aspect of the invention, an optical proximity correction process for correcting errors in an image is provided. The process includes the steps of determining an amount by which a width of the image is to be modified, providing a template for producing the image where the template has a feature with edges and arrays as described above, and adjusting the segmentation periods of the arrays to control the width of the image.

DETAILED DESCRIPTION OF THE PREFERRED EMBODIMENTS

The present invention will be described with particular reference to photomask patterns used in VLSI lithography for semiconductor processing. It will be appreciated that the invention applies to imaging and printing processes generally, where the size of a feature in a template causes formation of an image having a related (not necessarily identical) size.

Figure 4A:
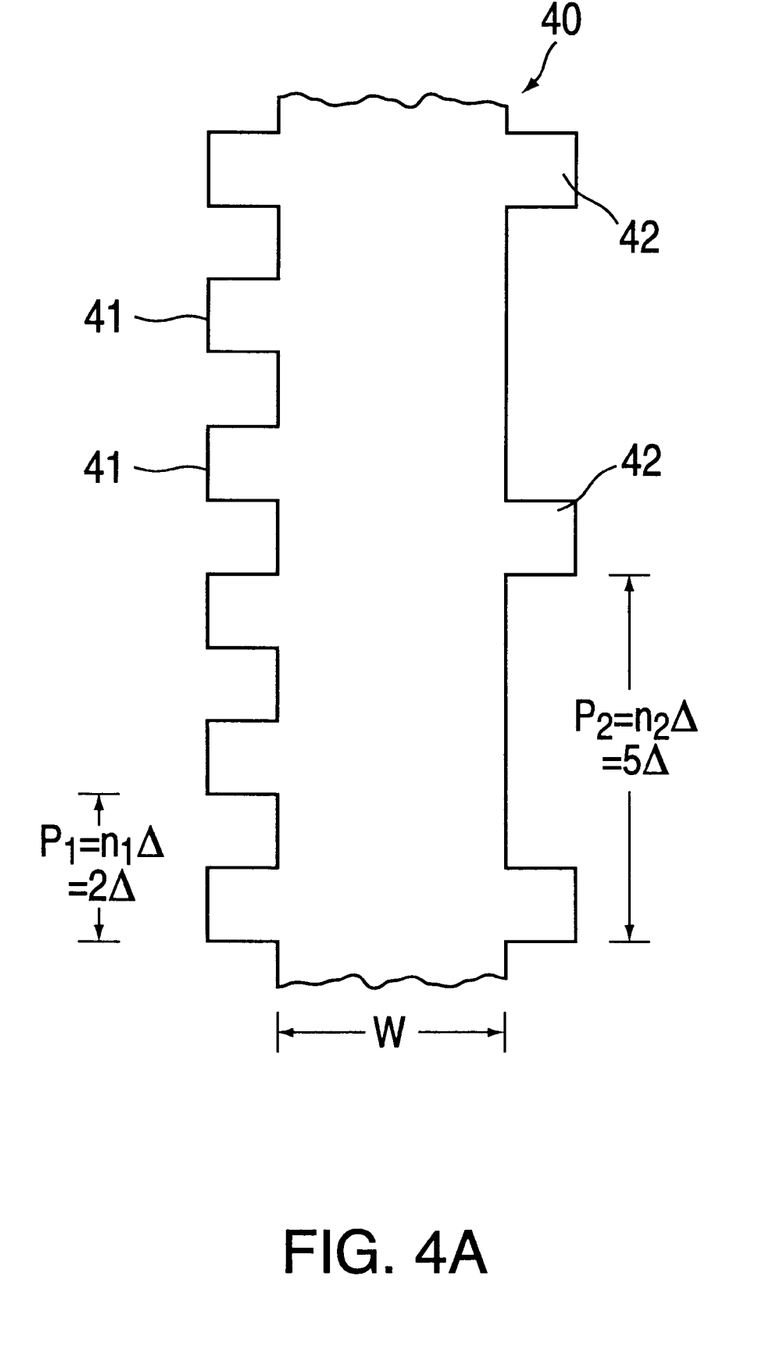
FIGS. 4A, 4B and 4C illustrate a sub-grid biasing pattern in accordance with a first embodiment of the present invention.
Figure 4B:
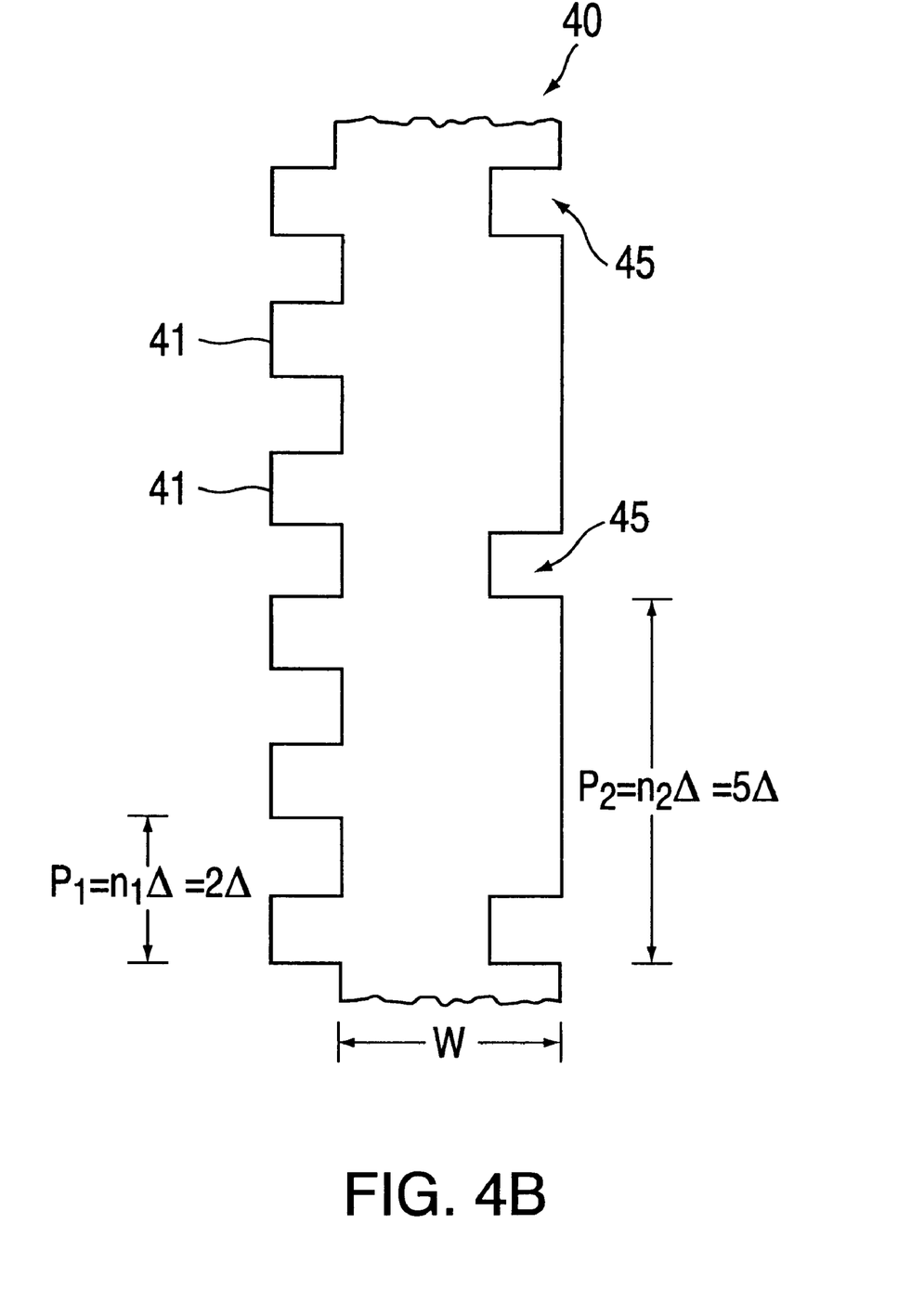
Figure 4C:
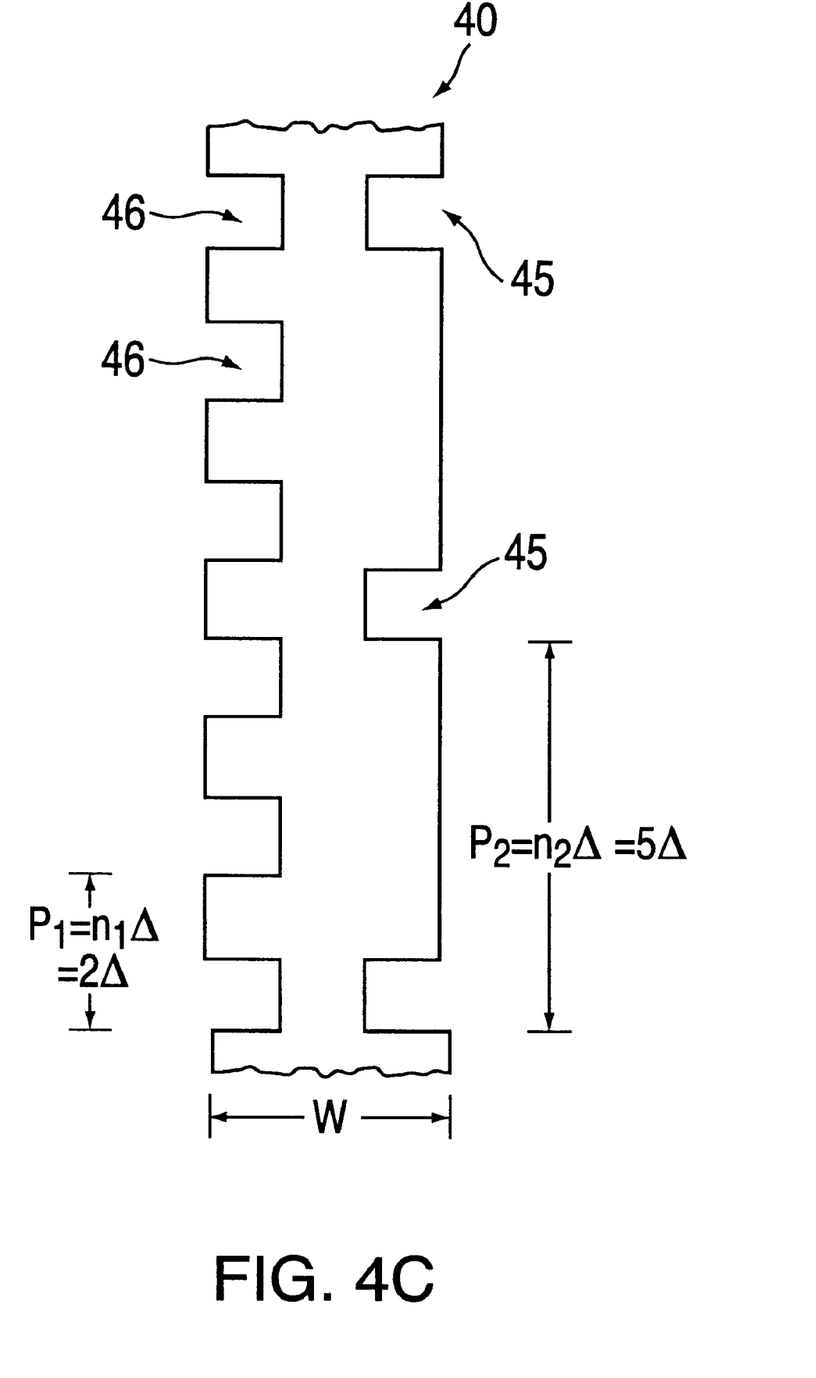
Figure 5A:
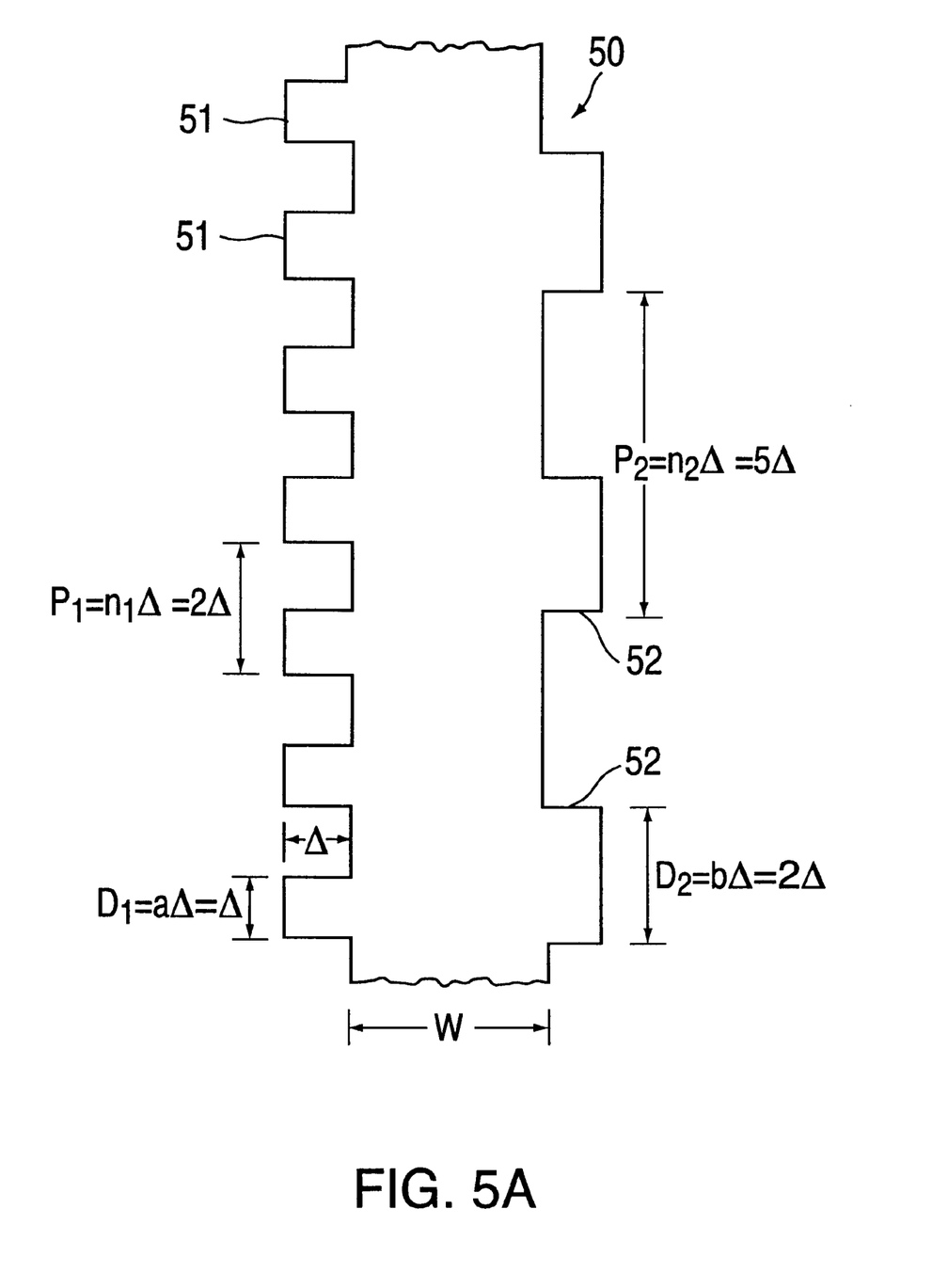
FIGS. 5A, 5B and 5C illustrate a sub-grid biasing pattern in accordance with a second embodiment of the present invention.
Figure 5B:
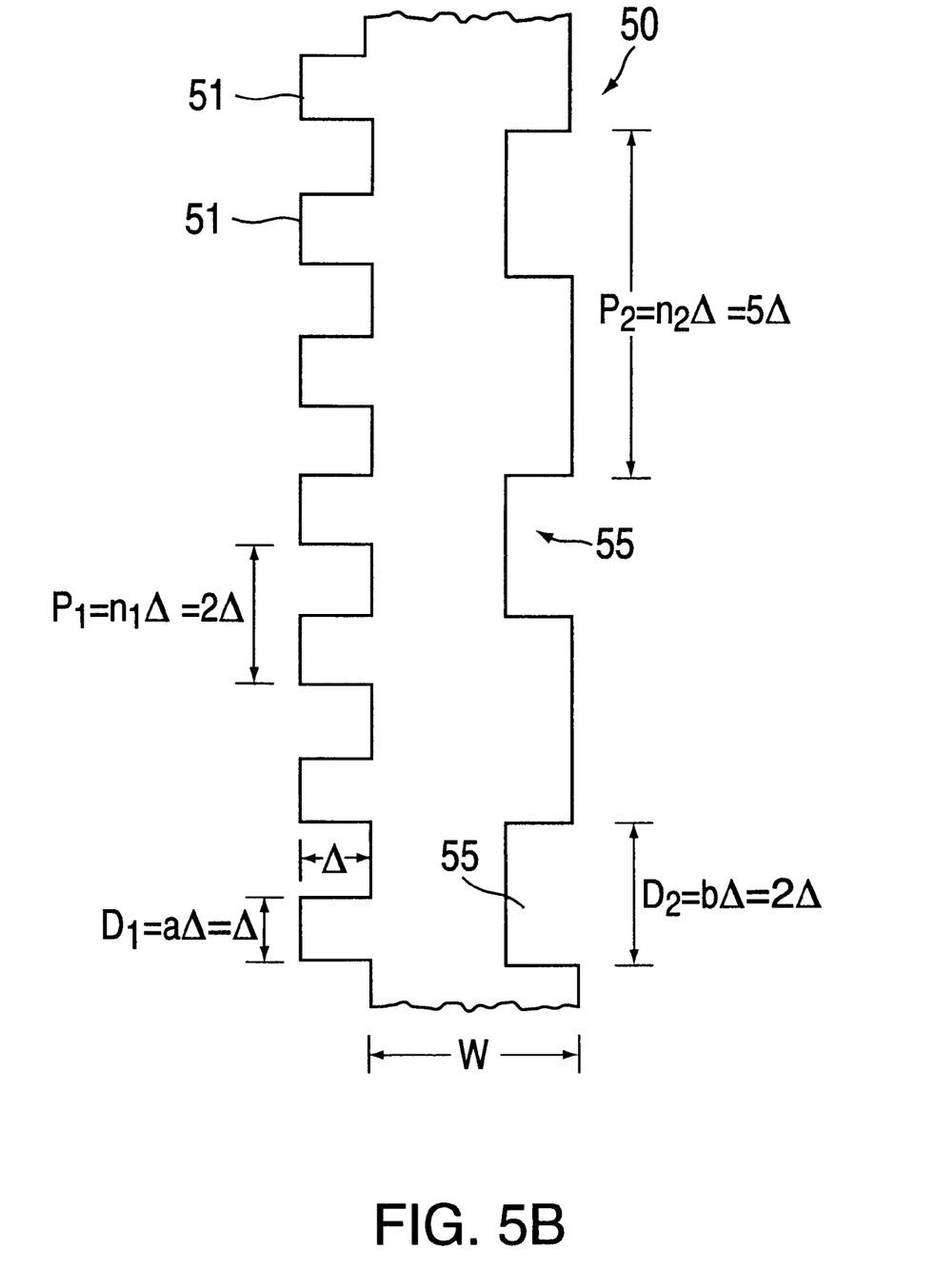
Figure 5C:
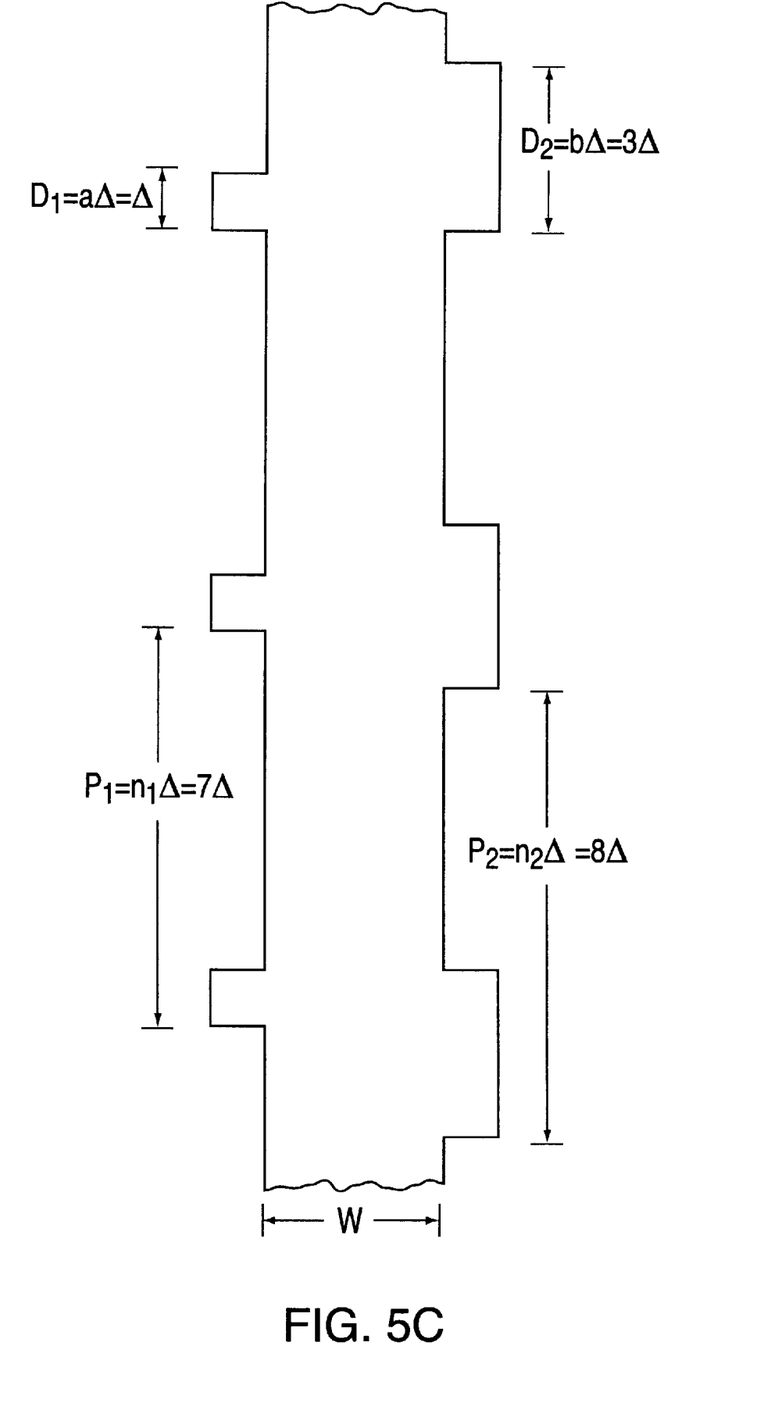
Figure 6A:
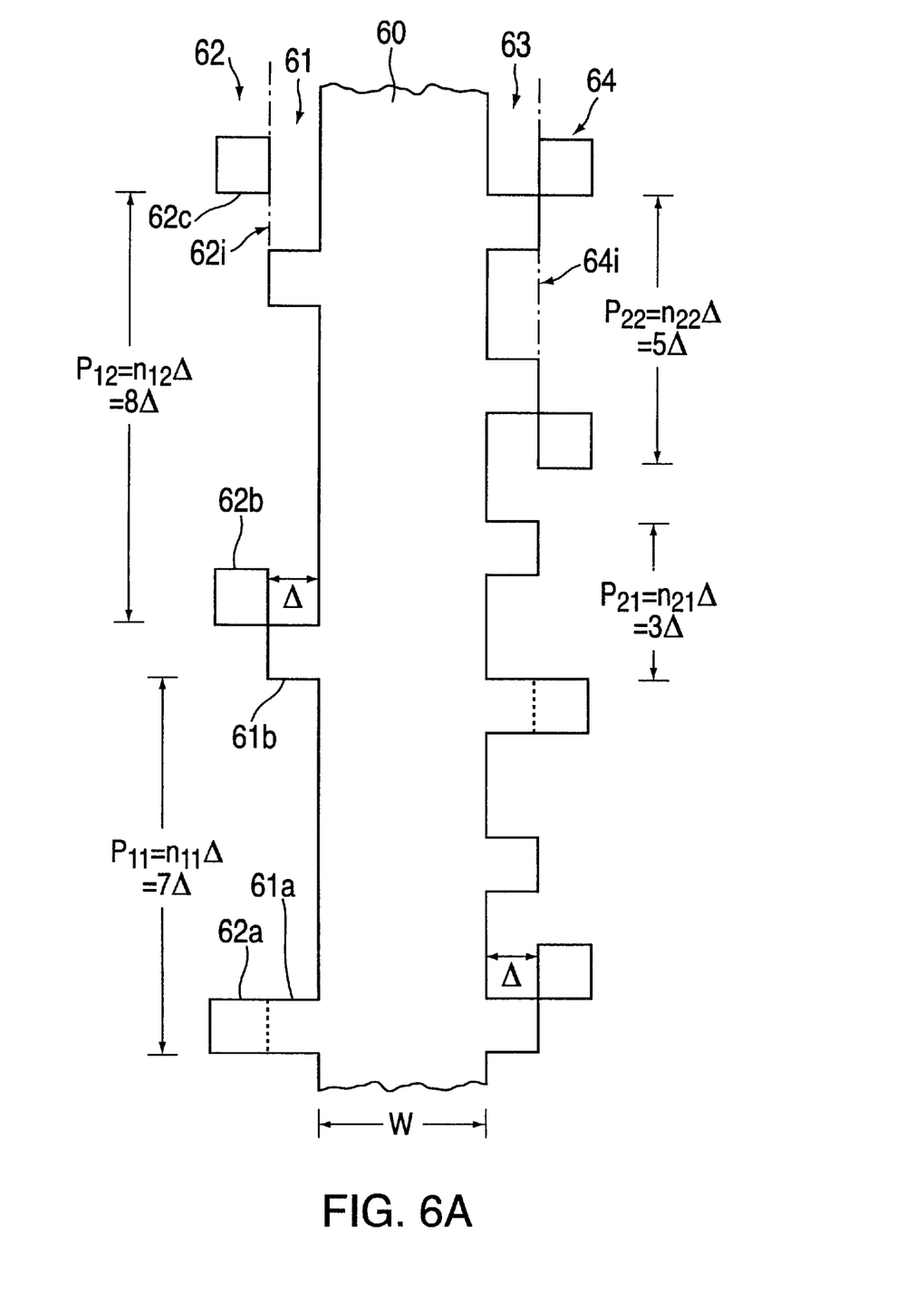
FIGS. 6A and 6B illustrate a sub-grid biasing pattern in accordance with a third embodiment of the present invention.
Figure 6B:
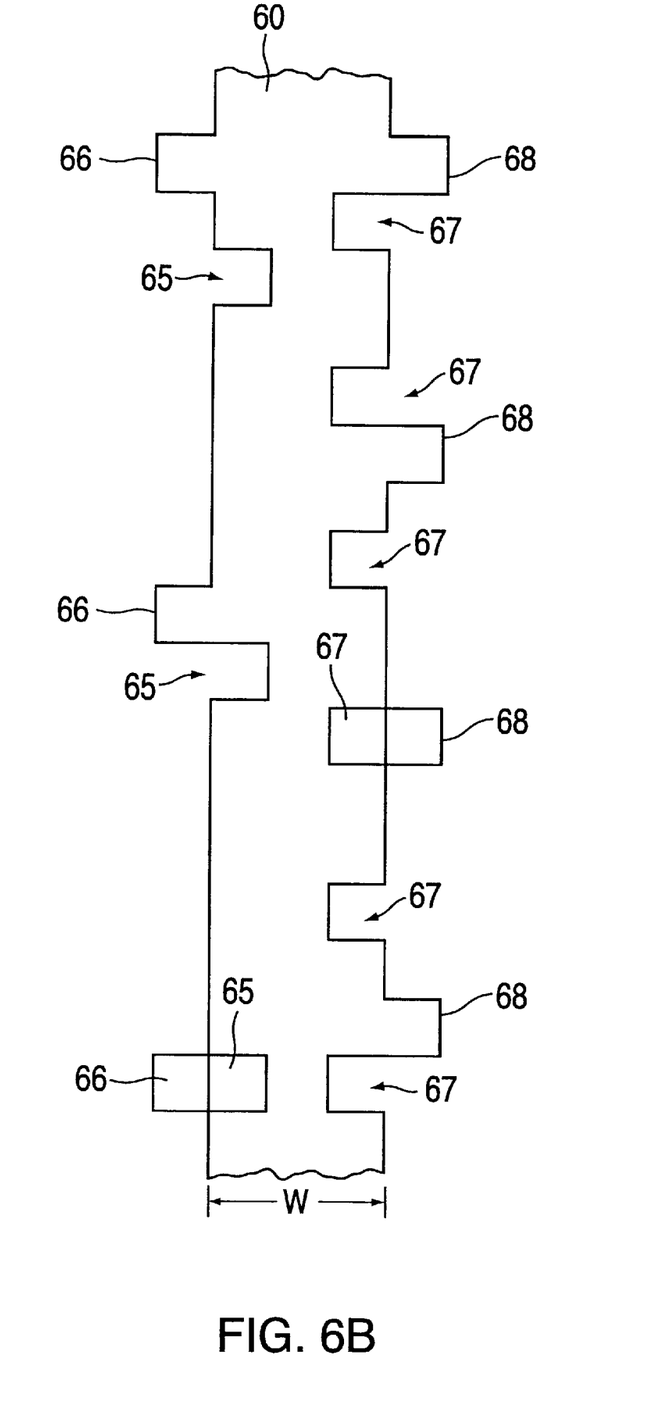

FIGS. 4–6 illustrate sub-grid biasing photomask patterns in accordance with three embodiments of the present invention. In these figures, W represents a critical dimension of a main feature line of rectangular shape having first and second edges (e.g., left and right edges), and $\Delta$ represents the width of a corresponding design grid.

A first embodiment of the invention is shown in FIG. 4A. On the first edge (left edge) of the main feature line 40, there are formed a plurality of identically shaped and identically spaced protrusions (a first protrusion array) 41. On the second edge (right edge) of the main feature line, there are formed a plurality of identically shaped and identically spaced protrusions (a second protrusion array) 42. The first and second protrusions 41, 42 each have a width $\Delta$. The first and second protrusions each have lengths D (measured along the main feature line) given by D=$\Delta$.

In contrast to the conventional arrangement of protrusions shown in FIGS. 2 and 3, the segmentation periods of the first protrusion array and the second protrusion array are different, so that the appearance of the line in the photomask pattern is asymmetrical. On the first edge, segmentation period $P_1=n_1\Delta$, where $n_1=2$; on the second edge, segmentation period $P_2=n_2\Delta$, where $n_2=5$.

The use of the asymmetric sub-grid biasing photomask pattern shown in FIG. 4A allows an apparent grid of $\Delta/10$. The edges of the printed image are shifted by distances of $(D/P_1)\Delta$ and $(D/P_2)\Delta$ respectively. Accordingly, the width W' of the printed image is given by $$W'=W+(D/P_1+D/P_2)\Delta$$

or, since D=$\Delta$, $P_1=n_1\Delta$, $P_2=n_2\Delta$, $$W'=W+(1/n_1+1/n_2)\Delta$$

so that $$W'=W+((n_2+n_1)/n_1 n_2)\Delta.$$

In the example of FIG. 4A, with $n_1=2$ and $n_2=5$, $W'=W+(7/10)\Delta$.

The edges of the line may have indentations or notches instead of, or in addition to, protrusions. FIG. 4B shows a feature line 40 of a template (e.g. a photomask) with an array of protrusions 42 on one edge and an array of indentations 45 on another edge. If indentations instead of protrusions are used, the edge of the printed line will be biased toward the center of the feature line, so that the width W' of the printed line is less than the width W of feature line 40. In the example of FIG. 4B, there is an array of protrusions with a segmentation period $P_1=n_1\Delta=2\Delta$ on the first edge, and an array of indentations with a segmentation period $P_2=n_2\Delta=5\Delta$ on the second edge. The width of the printed image of the line is then given by $$W'=W+(D/P_1-D/P_2)\Delta$$

so that $$W'=W+(1/n_1-1/n_2)\Delta$$

or $$W'=W+((n_2-n_1)/n_1n_2)\Delta.$$

In the example of FIG. 4B, with $n_1=2$ and $n_2=5$, $W'=W+(3/10)\Delta$.

FIG. 4C shows a feature line 40 of a template with arrays of indentations on both edges. The arrangement is similar to FIG. 4B, except that the array of protrusions 41 on the first (left) edge have been replaced by an array of indentations 46. In this case the width of the printed image of the line is $$W'=W-(D/P_1+D/P_2)\Delta$$

so that $$W'=W-(1/n_1+1/n_2)\Delta$$

or $$W'=W-((n_2+n_1)/n_1n_2)\Delta.$$

In FIG. 4C, $n_1=2$ and $n_2=5$, as in FIGS. 4A and 4B; thus $W'=W-(7/10)\Delta$.

In general, the apparent grid achievable by segmenting the two edges of a line with two different periods (that is, with $n_1$ different from $n_2$) is $\Delta/LCM$, where LCM is the least common multiple of $n_1$ and $n_2$. The upper limit of both $n_1$ and $n_2$ is given by $n_{max}$:

$$n_{max}\Delta \leq \lambda/NA(1+\sigma).$$

When $n_{max}=8$, as in the example above, an apparent grid as small as $\Delta/56$ can be achieved, e.g. with $n_1=7$ and $n_2=8$.

FIGS. 5A, 5B and 5C show a sub-grid biasing pattern for a template (e.g. a photomask) in accordance with a second embodiment of the invention. In FIG. 5A, feature line 50 has a plurality of protrusions (a first protrusion array) 51 on the first (left) edge, and another plurality of protrusions (a second protrusion array) 52 on the second (right) edge. In this embodiment, the protrusions/indentations in the first and second arrays have different lengths (measured along the edge of the feature); for example, in FIG. 5A the first protrusions 51 have a length $D_1=a\Delta$, where $a=1$, and the second protrusions 52 have a length $D_2=b\Delta$, where $b=2$.

As in the first embodiment, the segmentation periods of the first and second protrusion arrays are different. On the first edge, segmentation period $P_1=n_1\Delta$, where $n_1=2$; on the second edge, segmentation period $P_2=n_2\Delta$, where $n_2=5$.

The use of the asymmetric sub-grid biasing photomask pattern again allows an apparent grid of $\Delta/10$, but with a biasing result different from FIG. 4A. In FIG. 5A, the first and second edges of the printed image are shifted by distances of $(D_1/P_1)\Delta$ and $(D_2/P_2)\Delta$ respectively. Accordingly, the width W' of the printed image is given by $$W'=W+(D_1/P_1+D_2/P_2)\Delta$$

or, since $D_1=a\Delta$, $D_2=b\Delta$, $P_1=n_1\Delta$, $P_2=n_2\Delta$, $$W'=W+(a/n_1+b/n_2)\Delta$$

so that $$W'=W+((an_2+bn_1)/n_1n_2)\Delta.$$

In the example of FIG. 5A, with $a=1$, $b=2$, $n_1=2$ and $n_2=5$, $W'=W+(9/10)\Delta$.

FIG. 5B shows an arrangement where an array of protrusions 51 is on the first edge of the feature line 50, and an array of indentations 55 is on the second edge. The width of the printed image of the line will then be $$W'=W+(a/n_1-b/n_2)\Delta$$

so that $$W'=W+((an_2-bn_1)/n_1n_2)\Delta.$$

As in FIG. 5A, with $a=1$, $b=2$, $n_1=2$ and $n_2=5$. Therefore, with the pattern of FIG. 5B, $W'=W+(1/10)\Delta$.

Assuming again that $n_{max}=8$, an apparent grid of $\Delta/56$ can be achieved with $n_1=7$ and $n_2=8$. If these segmentation periods are used, and two arrays of protrusions are used with protrusion lengths $D_1=\Delta$ and $D_2=3\Delta$, the arrangement is as shown in FIG. 5C. The width of the printed image of the line will then be $W'=W+((8+21)/56)\Delta=W+(29/56)\Delta$.

In the preceding two embodiments, it has been assumed that each edge of the feature line has one array of protrusions (or indentations), so that each edge has one predetermined segmentation period. In a third embodiment of the invention, there is more than one segmentation period for each edge; this permits the apparent grid to be further refined. For example, if $n_{max}=8$ and there are two segmentation periods per edge, then the first (left) edge can be segmented with $n_{11}=7$ and $n_{12}=8$, and the second (right) edge can be segmented with $n_{21}=3$ and $n_{22}=5$. This embodiment is illustrated in FIGS. 6A and 6B.

In FIG. 6A, feature line 60 has arrays of protrusions 61, 63 on the left edge and the right edge respectively, with segmentation periods $7\Delta$ and $8\Delta$. As can be seen in FIG. 6A, the additional arrays 62, 64 each have an inner boundary 62i, 64i coinciding with the outer boundaries of the protrusion arrays 61, 63 respectively. This means that arrays 62 and 64 have areas which in general are not connected to the feature line 60, but lie a distance $\Delta$ from the edge. Depending on the relative segmentation periods, arrays 61 and 62 may give rise to a straight protrusion from the edge (caused by areas 61a and 62a being coincident in the direction along the edge), a shape where a protrusion from the edge touches another area at one corner (for example, areas 61b, 62b), or a case where an area such as 62c is completely separated from feature line 60.

With the arrangement of FIG. 6A, the width W' of the printed image of the line is given by $$W'=W+(1/n_{11}+1/n_{12}+1/n_{21}+1/n_{22})\Delta$$

so that $$W'=W+((n_{12}n_{21}n_{22}+n_{11}n_{21}n_{22}+n_{11}n_{12}n_{22}n_{11}n_{12}n_{21})/n_{11}n_{12}n_{21}n_{22})\Delta.$$

Since in this example $n_{11}=7$, $n_{12}=8$, $n_{21}=3$, $n_{22}=5$, $$W'=W+((120+105+280+168)/840)\Delta=W+(673/840)\Delta.$$

FIG. 6B is similar to FIG. 6A, except that arrays of protrusions 61, 63 have been replaced by arrays of indentations 65, 67 on the first and second edges respectively. Accordingly, the inner boundary of the additional arrays 66, 68 has shifted inwards to become coincident with the edge of the feature line; the shapes in those arrays may sometimes appear as a protrusion from the feature line. The segmentation periods of arrays 65, 66, 67 and 68 are again 7Δ, 8Δ, 3Δ, and 5Δ respectively. In this case the width of the printed image is given by $$W'=W+(-1/n_{11}+1/n_{12}-1/n_{21}+1/n_{22})\Delta$$

so that $$W'=W+((-n_{12}n_{21}n_{22}+n_{11}n_{21}n_{22}-n_{11}n_{12}n_{22}+n_{11}n_{12}n_{21})/n_{11}n_{12}n_{21}n_{22})\Delta.$$

and thus $$W'=W+((-120+105-280+168)/840)\Delta=W-(127/840)\Delta.$$

The use of multiple segmentation periods at a single edge, as illustrated in FIGS. 6A and 6B, results in an apparent grid of $\Delta/(8\times7\times3\times5)=\Delta/840$. Accordingly, in this embodiment of the invention the apparent grid can be nearly three orders of magnitude smaller than the corresponding design grid.

In these illustrations of the third embodiment, all of the shapes in the arrays (the elements of the various arrays) have the same length Δ. It will be appreciated that the shapes may have different lengths (that is, various integral multiples of Δ), as in the second embodiment. This permits still greater control over the width W' of the printed image.

In the foregoing description of the third embodiment, two arrays of shapes were disposed along each edge of a feature line. It will be appreciated that this arrangement can be extended to three or more arrays of shapes on each side of the feature line. Each array has an inner boundary which coincides with the outer boundary of the neighboring array closer to the edge of the feature line.

The advantage of the present invention regarding mask write time can be easily seen from a numerical example: if the apparent grid is Δ/20 (such as in the first embodiment with $n_1=4$ and $n_2=5$) and the design grid Δ is 25 nm, the biasing increment is then 1.25 nm. If asymmetric halftone biasing according to the present invention is applied, the write time is (asymptotically) $20^2=400$ times faster than writing with a design grid of 1.25 nm.

Figure 7:
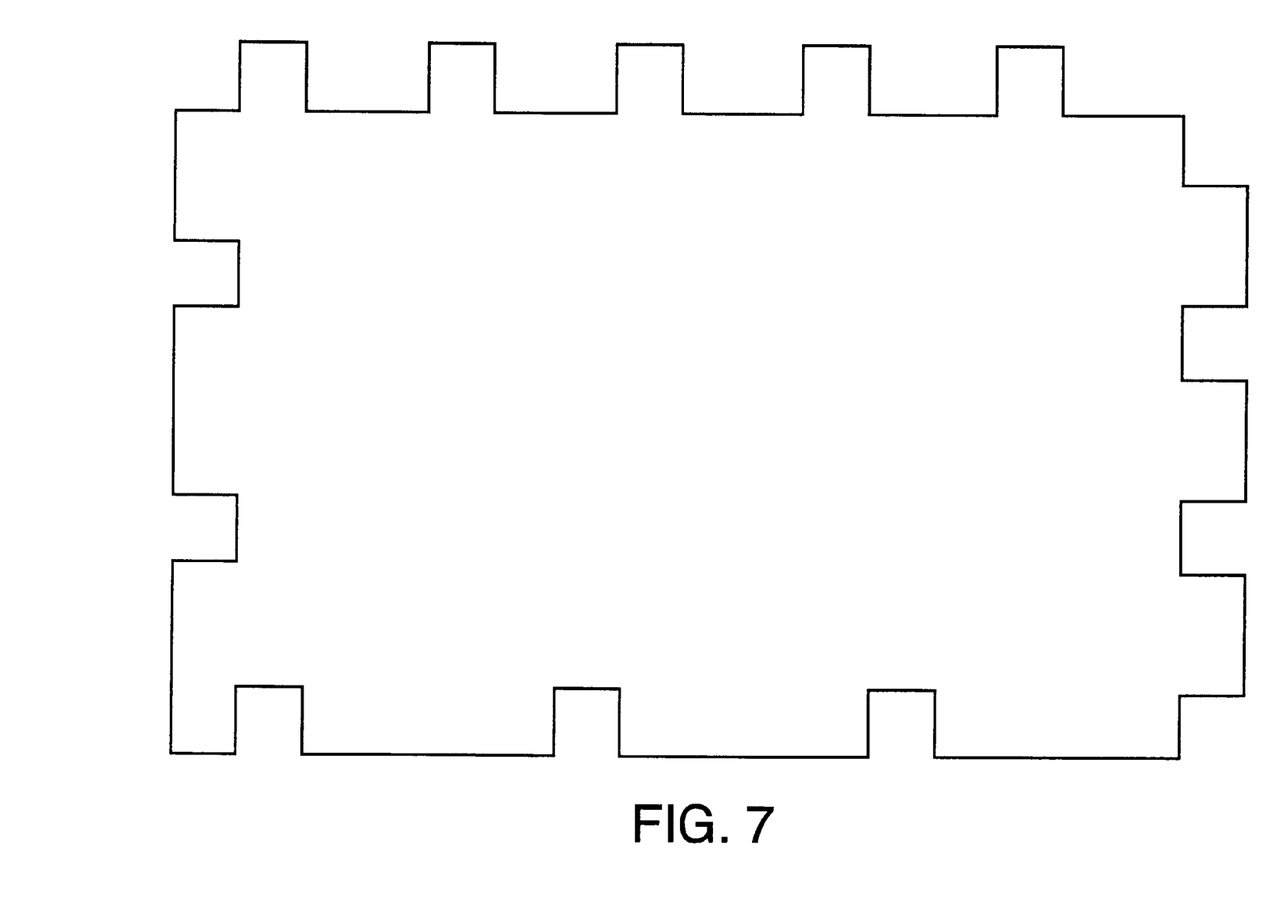
FIG. 7 illustrates application of the present invention to a two-dimensional pattern feature.

In the description of these embodiments, a one-dimensional feature line has been assumed. It will be appreciated that the present invention is also applicable to two-dimensional features, such as rectangles, for both length and width control. As shown in FIG. 7, the edges of the two-dimensional feature may have either protrusions or indentations of various lengths, as described in detail above. Furthermore, it will be appreciated that in the present invention, the features of a template (such as a photomask) can be controlled so that the printed images are of different sizes, even though the features are nominally all the same size. One application where this may be desirable is pattern correction and control for distinct n-gate and p-gate compensation.

Figure 8:
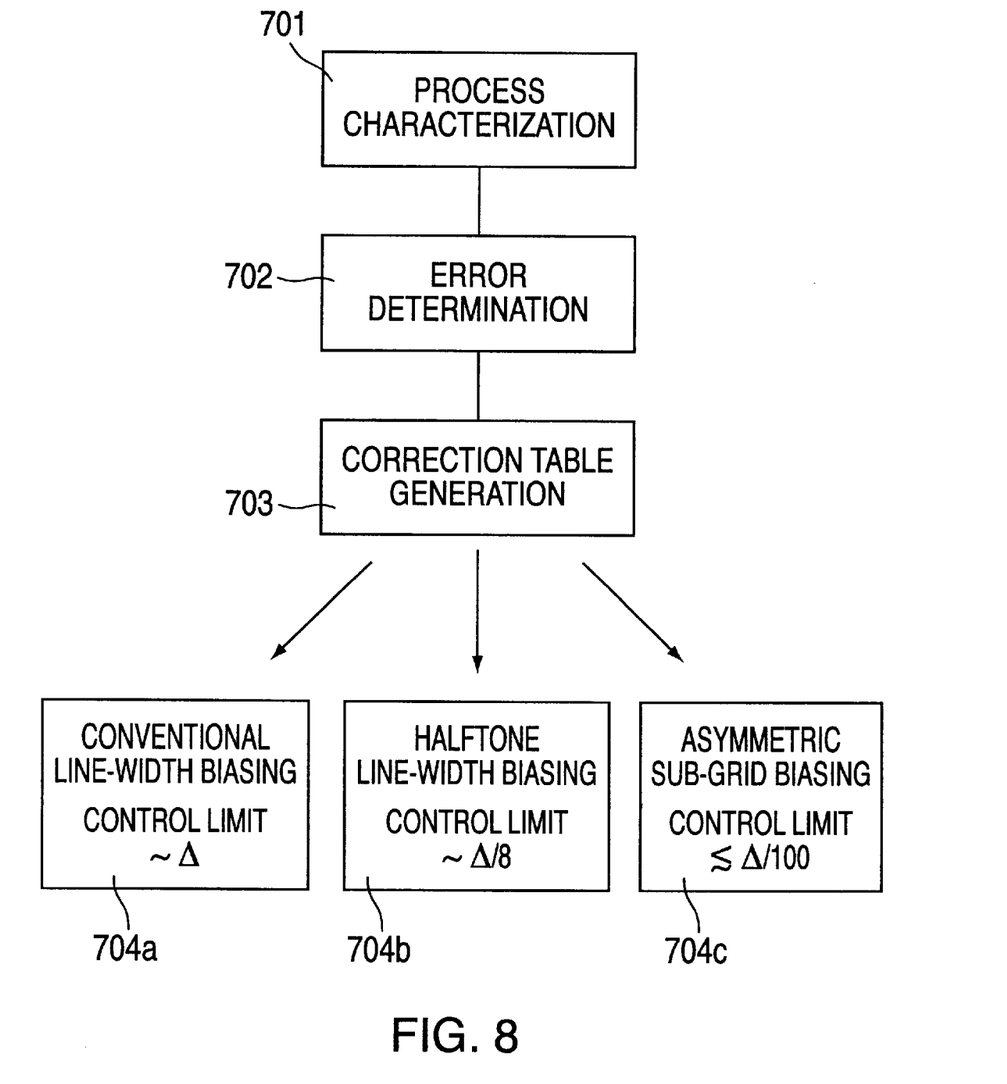
FIG. 8 outlines steps in an optical proximity correction (OPC) process in accordance with the present invention, in contrast to conventional OPC processes.

The present invention may be applied to the general technique of optical proximity correction (OPC) for control of the size of a printed pattern. OPC has been shown to be very useful in reducing variation of critical dimensions in circuits. In general, as shown in FIG. 8, an OPC process involves steps of process characterization (step 701), error determination (step 702) and correction table generation (step 703). A conventional OPC process employs line width biasing to achieve control of critical dimensions (step 704a). For a design grid of Δ, the dimension control limit is on the order of Δ. If instead a halftone line-width biasing process is used (step 704b), the dimension control limit is $\Delta/n_{max}$ which, as noted above, is typically about Δ/8. However, if the asymmetric biasing technique of the present invention is used (step 704c), the dimension control limit can be substantially less than Δ/100.

While the present invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A template for producing an image, the template characterized by a minimum template size, the template comprising:
   a feature having a nominal size and having a first edge and a second edge opposite the first edge; and
   a first array of shapes and a second array of shapes disposed on the first edge and second edge respectively, each of the first array and the second array being one of an array of protrusions from the feature and an array of indentations in the feature, the first array and the second array having a first segmentation period and a second segmentation period measured along the first edge and the second edge respectively, the first segmentation period being different from the second segmentation period so that the first array is different from the second array, thereby causing the feature to be asymmetrical,
   wherein said template causes the image to have a size differing from the nominal size by an increment which is a fraction of the minimum template size.

2. A template according to claim 1, wherein the feature is a line having a nominal width defined by the first edge and the second edge and which is asymmetrical, in accordance with the first array being different from the second array.

3. A template according to claim 2, wherein the first array and the second array each have an outer boundary, and further comprising at least one additional array of shapes having an inner boundary coincident with the outer boundary of one of the first array and the second array, the first array, the second array and the additional array having different segmentation periods.

4. A template according to claim 1, wherein each array is formed of a plurality of identical shapes repeating at every corresponding segmentation period, each of the shapes of the first array having a predetermined length along the first edge and a first predetermined width, and each of the shapes of the second array having a predetermined length along the second edge and a second predetermined width.

5. A template according to claim 4, wherein all shapes in each of the arrays have an identical width.

6. A template according to claim 5, wherein each shape has a length which is a first multiple of the identical width, and the segmentation period of each array is a second multiple of the identical width, the second multiple being greater than the first multiple.

7. A template according to claim 3, wherein at least one edge has a plurality of arrays of shapes disposed along the edge, each of the arrays having an inner boundary and an outer boundary with respect to the edge, the inner boundary of a given array being coincident with the outer boundary of a neighboring array closer to the edge, the arrays having different segmentation periods.

8. A template according to claim 4, wherein the first array is formed of shapes having a first length and the second array is formed of shapes having a second length different from the first length.

9. A template for producing an image, the template characterized by a minimum template size, the template comprising:
    a feature having a nominal size and having a first edge and a second edge opposite the first edge;
    a first array of shapes disposed on the first edge and having a first segmentation period measured along the first edge; and
    a second array of shapes disposed on the second edge and having a second segmentation period measured along the second edge,
    wherein
        the first segmentation period is different from the second segmentation period, thereby causing the feature to be asymmetrical,
        each of the shapes is one of a protrusion from the feature and an indentation in the feature, and
        said template causes the image to have a size differing from the nominal size by an increment which is a fraction of the minimum template size.

10. A template according to claim 9, wherein the first array and the second array each have an outer boundary, and further comprising at least one additional array of shapes having an inner boundary coincident with the outer boundary of one of the first array and the second array, the first array, the second array and the additional array having different segmentation periods.

11. A template according to claim 9, wherein each array is formed of a plurality of identical shapes repeating at every corresponding segmentation period, each shape of the first array having a predetermined length along the first edge and a first predetermined width, and each shape of the second array having a predetermined length along the second edge and a second predetermined width.

12. A template according to claim 11, wherein all shapes in each of the arrays have an identical width.

13. A template according to claim 12, wherein each shape has a length which is a first multiple of the identical width, and the segmentation period of each array is a second multiple of the identical width, the second multiple being greater than the first multiple.

14. A template according to claim 10, wherein the first edge and the second edge each have two arrays of shapes.

15. A template according to claim 14, wherein each of the arrays is formed of a plurality of identical shapes repeating at every corresponding segmentation period, each shape having a predetermined length along the edge and a predetermined width, so that the two arrays at each edge are each characterized by a shape length and a segmentation period and have different segmentation periods and different shape lengths.

16. A template for producing an image, the template characterized by a minimum template size, the template comprising:
    a two-dimensional feature having a nominal size in each dimension and having a plurality of edges; and
    a first array of shapes and a second array of shapes disposed on the respective edges, the first array and the second array having a first segmentation period and a second segmentation period measured along the edges respectively,
    wherein
        the first segmentation period and the second segmentation period are different from each other, thereby causing the feature to be asymmetrical, and
        said template causes the image to have a size in each dimension differing from the nominal size by an increment which is a fraction of the minimum template size.

17. A template according to claim 16, wherein the two-dimensional feature is a rectangle having two pairs of opposite edges, and further comprising an array of shapes disposed along each of the edges, each array being one of an array of protrusions from the feature and an array of indentations in the feature, each array in a pair of arrays on opposite edges having a different segmentation period for both length and width control.

* * * * *